United States Patent [19]

Meyer

[11] Patent Number: 4,914,394
[45] Date of Patent: Apr. 3, 1990

[54] POCKET-SIZE TIME DOMAIN REFLECTOMETER

[75] Inventor: Jack R. Meyer, Fairfax, Va.

[73] Assignee: Electromagnetic Techology, Inc., Fairfax, Va.

[21] Appl. No.: 279,265

[22] Filed: Dec. 1, 1988

Related U.S. Application Data

[63] Continuation of Ser. No. 891,387, Jul. 31, 1986, abandoned.

[51] Int. Cl.$^4$ .............................................. G01K 31/11
[52] U.S. Cl. .................................... 324/534; 324/533; 324/543
[58] Field of Search ............... 324/534, 532, 533, 535, 324/58 R, 58.5 R, 58 B, 58.5 B, 539, 541, 543, 544; 367/118, 121, 123, 99

[56] References Cited

U.S. PATENT DOCUMENTS

| | | | |
|---|---|---|---|
| 2,499,000 | 2/1950 | Quarles | 324/534 X |
| 2,651,752 | 1/1948 | Devot . | |
| 3,221,997 | 1/1960 | Hara . | |
| 3,244,975 | 4/1966 | Bauer . | |
| 3,244,978 | 4/1966 | Craven et al. . | |
| 3,434,049 | 3/1969 | Frye . | |
| 3,727,128 | 4/1973 | McFerrin . | |
| 3,781,665 | 12/1973 | Gale . | |
| 4,023,154 | 5/1977 | Comeaux | 324/533 |
| 4,165,482 | 8/1979 | Gale . | |
| 4,491,782 | 1/1985 | Bellis et al. . | |
| 4,734,637 | 3/1988 | Chen et al. | 324/58.5 B X |
| 4,766,386 | 8/1988 | Oliver et al. | 324/533 |

Primary Examiner—Reinhard J. Eisenzopf
Assistant Examiner—Robert W. Mueller

[57] ABSTRACT

A pocket-size Time Domain Reflectometer is described. The pocket-size Time Domain Reflectometer consists of a pulse generator for producing a test pulse along with a delay line for delaying the test pulse before it is transmitted to a cable whose impedance characteristics are to be determined along its entire length. A test connector outputs the delayed test pulse to the cable that is being tested and the test connector receives reflections of the test pulse produced by the cable. The delay pulse generator produces a delay pulse having a pulse width identical to the test pulse at a time t after the production of a test pulse determined by the delay adjuster which is set in accordance with the specific point along the length of the cable which is being tested. A reflection sensing device is reponsive to the delay pulse and reflections received by the test connector and produces a reflection output signal which is monitored by a meter. The meter then produces an output indicative of the impedance characteristics of the cable at any specific point as selected by delay pulse t that is being tested in accordance with the reflection sensing output signal.

15 Claims, 1 Drawing Sheet

POCKET-SIZE TIME DOMAIN REFLECTOMETER

This application is a continuation, continuation-in-part, of application Ser. No. 06/891,389 filed on July 31, 1986, now abandoned.

BACKGROUND OF THE INVENTION

The present invention relates to a pocket-size time domain reflectometer. More particularly, the present invention relates to a reflectometer for testing a cable to determine the impedance characteristics of the cable at any point along its length, where the reflectometer is small in size and provides a meter reading indicative of the impedance characteristic at a predetermined distance along the cable.

Reflectometers for testing cables are known. Conventionally, reflectometers generate a test signal which is transmitted to a cable that is to be tested. The cable then generates a reflection of the test signal and transmits the reflection back to the reflectometer. The reflectometer senses the reflection, and displays it on an oscilloscope. The display on the oscilloscope enables an operator to determine the impedance characteristics at any point of the cable that is being tested. Such reflectometers have disadvantages in that the use of an oscilloscope tends to make the reflectometer bulky and not well suited for being pocket-size. Such reflectometers generally contain complicated high speed circuitry for displaying the reflection of the test signal from the cable in real time. This type of reflectometer gives a total picture of the impedance characteristic along the entire cable length at a glance, however, it is expensive and relatively large in size.

SUMMARY OF THE INVENTION

It is a primary object of the present invention to provide an improved time domain reflectometer.

It is another object of the present invention to provide a pocket-size time domain reflectometer.

It is still another object of the present invention to provide a low cost meter in a pocket-size time domain reflectometer to display the impedance characteristics of a cable being tested at a predetermined point along its length in accordance with the reflection of a test signal transmitted to the cable by the reflectometer.

It is a further object of the present invention to provide a pocket-size time domain reflectometer which can be adjusted so as to test the impedance of cables at any point along their length.

It is still a further object of the present invention to provide a pocket-size time domain reflectometer with circuitry which reduces the overall size of the reflectometer and reduces the overall cost for producing the reflectometer.

The objects of the present invention are fulfilled by providing a pocket-size time domain reflectometer for testing a cable to determine the impedance characteristics of the cable at any point along its length, comprising:

(a) a first pulse generator for producing a test pulse;

(b) a test connector for connecting the reflectometer to the cable, transmitting the test pulse to the cable, and for receiving any reflections by the cable of the test pulse;

(c) adjustable second pulse generator for producing a delay pulse at a time t following the production of the test pulse where time t can be adjusted in accordance with a predetermined position along the length of the cable being tested;

(d) reflection signal sensor for sensing a reflection by the cable of the test pulse and producing a reflection sensing output signal that is indicative of the presence in magnitude of a reflection signal from the cable at that predetermined position that has been received by the test connector; and (e) a meter, connected to the reflection signal sensing means, for producing a meter reading indicative of the impedance characteristics of the cable in accordance with the reflection-sensing output signal.

In a preferred embodiment of the present invention, the test pulse and the delay pulse have identical pulse widths of approximately 15 nanoseconds.

Further scope of applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
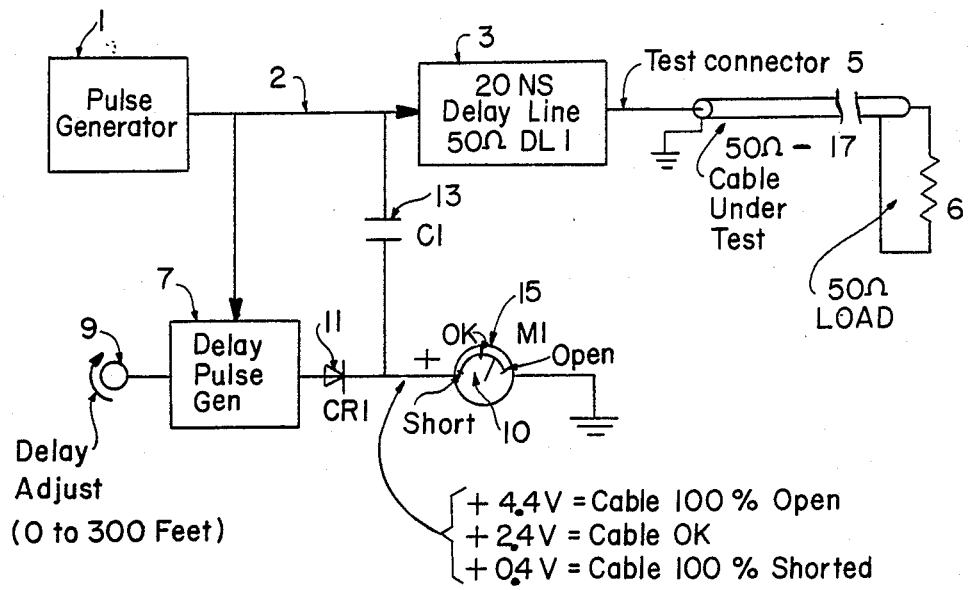
FIG. 1 is a block diagram of a circuit for a pocket-size time domain reflectometer of the present invention.

A preferred embodiment of the present invention is disclosed in FIG. 1. FIG. 1 illustrates a block diagram of a circuit of a pocket-size time domain reflectometer. A cable under test, 17, having a load 6 connected to its far end is connected to a test connector 5. A pulse generator 1 is connected to a delay line 3 which is connected to the test connector 5 thereby creating a path for a test signal to the cable under test. A delay pulse generator 7 is connected to a delay adjuster 9 for adjusting the time delay for producing a delay pulse and the delay pulse generator is connected to a capacitor 13 and a meter 15 through a diode 11. The capacitor 13 is also connected to a line, 2, connecting the pulse generator 1 and the delay line 3.

Figure 2A:
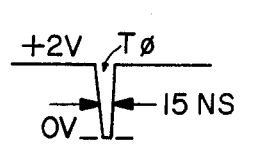
FIG. 2(A) is a graph representing a test pulse signal produced by a pulse generator of a pocket-size time domain reflectometer of FIG. 1.
Figure 2B:
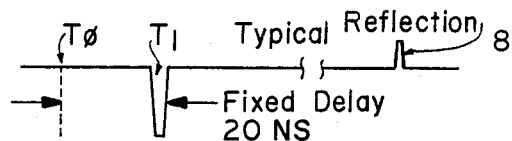
FIG. 2(B) is a graph representing an output test signal which is transmitted to a cable to be tested by the pocket-size time domain reflectometer of FIG. 1.
Figure 2C:
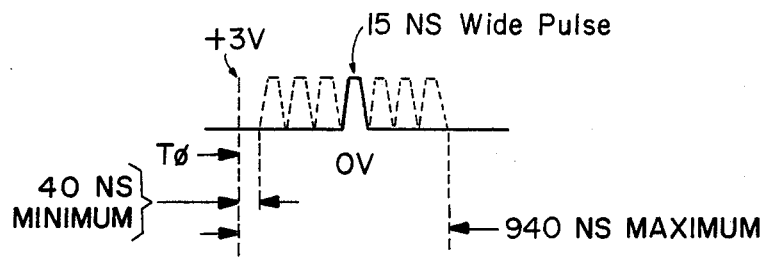
FIG. 2(C) is a graph of a delay pulse created by a delay pulse generator of the pocket time domain reflectometer of FIG. 1.

In operation, the pulse generator 1 produces a test pulse of a predetermined width. A typical test pulse is shown in FIG. 2(A). The test pulse is produced at time $T_o$. The test pulse is transmitted to the delay line 3. The delay line delays the test pulse by a fixed amount of time, equal to $T_1-T_o$, before it is transmitted to the test connector 5. A typical delayed test pulse, 6, is disclosed in FIG. 2(B). The delayed test pulse is then sent from the test connector 5 to the cable 17 under test. Once the test pulse is transmitted from the pulse generator 1, a delayed pulse having the same pulse width but opposite polarity as the test pulse will be produced by delay pulse generator 7 at a time t following the creation of the test pulse by pulse generator 1. The time delay for producing this delayed pulse, t, can be adjusted by the delay adjuster 9 so that the proper delay time t can be set in accordance with a position along the length of cable that is being tested by the reflectometer. The delay adjuster 9 permits an operator to adjust the delay time so that time t can be gradually adjusted along the entire length of the cable that is undergoing testing. A sample delay pulse created by the delay pulse generator is shown in FIG. 2(C) where it can be seen that the pulse width of the delay pulse is identical to the pulse width of the test pulse of FIG. 2(A) and is of opposite polarity. The dotted lines indicate that such a delay pulse can be produced at variable delay times.

The test connector 5, in addition to outputting the delayed test pulse also receives reflections by the cable of the test pulse. A typical reflection signal, 8 is disclosed in FIG. 2(B). These reflections are transmitted to the delay line 3 which then adds delay to the reflections. The timing of the delay pulse produced by the delay pulse generator and the delay added to the reflection signal received by the test connector is adjusted so as to produce a voltage across capacitor 13 that is representative of the impedance characteristics of the cable 17 at the position along its length that corresponds to the position as preselected by delay adjuster 9.

A high impedance meter 15 detects the voltage charge at the bottom of the capacitor 13. When there are no reflection signals received by the test connector that correspond in time to the delayed pulse t, the top of the capacitor 13 normally has a +2 volt charge due to the signal from the pulse generator that remains at 2 volts in the absence of a pulse as disclosed in FIG. 2(A). When a delay pulse is generated by the delay pulse generator with no corresponding reflection there is a voltage drop across the diode 11 of 0.6 volts and the bottom of the capacitor C1 charges to +2.4 volts. Because of the high impedance of the meter the capacitor C1 will discharge slowly through the meter in the absence of a positive delay pulse that would charge the bottom of the capacitor 13. When no reflection is detected by the test connector 5 at time t the meter will detect 2.4 volts at the bottom of the capacitor 13 and the meter will indicate that the cable being tested is in good condition at the preselected position along its length. This is indicated on the face of the meter 15, which indicates that the test cable is okay or that the test cable is open circuited or that the test cable is short circuited.

If at a given delay setting of the delay pulse generator, a positive reflection from the cable 17 under test is received, the charge on the bottom of the capacitor 13 will be descreased by an amount equal to the amplitude of the reflected pulse. As a result, the reading on the meter M1 will be decreased by an amount equal to the amplitude of the reflection. This would indicate that the cable has an impedance point lower than its general characteristic at the preselected position along its length. If the voltage at the bottom of C1 falls to 0.4 volts then the meter will indicate that the cable is 100% short circuited.

If at a given delay setting of the delay pulse generator, a negative reflection from the cable under test is received, there will be an increase in the voltage on the bottom of C1 by an amount equal to the amplitude of the reflected pulse. As a result the reading on the meter M1 will be increased by an amount equal to the amplitude of this reflection. If the voltage at the bottom of the capacitor 13 reaches 4.4 volts the meter will indicate that the cable is 100% open circuited.

In the embodiment of the present invention disclosed in FIG. 1, a pocket-size time domain reflectometer for testing the impedance characteristic at any point along a test cable has relatively non-complex circuitry. By using a meter which detects changes in voltage at a given point, where such changes are dependent upon the presence of reflections from the test cable of a test signal, the operator is able to get a quick reading of the impedance characteristics of any point along the cable without the requirement of reproducing the reflection signal on an oscilloscope as is done in conventional time domain reflectometers.

The pocket-size time domain reflectometer of the present invention therefore provides a reflectometer for testing the impedance characteristics of a cable at any point along its length with the reflectometer being relatively inexpensive and small in size. In the embodiment of the present invention as disclosed in FIG. 1, the delay adjuster, in conjunction with the delay pulse generator, can produce a pulse having a pulse width that is identical to the pulse width of the test pulse produced by the pulse generator at a time t which can be from 40 nanoseconds to 940 nanoseconds after the pulse generator 1 produces the test pulse. This time delay corresponds to a reflection arrival time from a cable fault that is located from 0 to 300 feet away from the test connector along the cable that is being tested. This is true for a 0.67 dielectric constant coaxial cable. These are by far the most common cables. Other cables may range between 0.5 and 1.0 dielectric constant and will require correction factors with regard to time delay. The operator can therefore adjust the time delay in accordance with the position along the length of cable that is being tested. All the operator needs to do is slowly turn the delay adjuster 9 thereby changing the setting for the length of cable being tested from a setting of zero feet to a setting corresponding to the maximum length of the cable under test, while observing the meter movement for any deflection.

Additionally, the meter of the present invention is a high impedance meter having a large mechanical inertia. The large mechanical inertia of the meter movement assures that the meter will not respond to very short pulses applied to it from the delay pulse generator, the pulse generator or any reflections from the cable under test. The meter will not be directly subject to movement due to pulses, but rather it moves to correspond with stabilized voltages that appear at the bottom of capacitor 13. The delay line 3 delays both the test pulse and the reflection from the cable. In an embodiment of the present invention, the delay line delays both the test pulse and the reflection from the cable under test by a fixed amount of approximately 20 nanoseconds.

The present invention, a time domain reflectometer, provides an apparatus for testing a cable to determine the impedance characteristics of a cable at any point along the entire cable and this apparatus is of a pocket size. The circuitry of the apparatus is of uncomplicated construction and is inexpensive as well as resulting in a reflectometer of small size. A test pulse is created which is subsequently delayed and transmitted to a test cable which then transmits a reflection back to the reflectometer. A delay pulse generator produces a delay pulse of a polarity opposite to the test pulse, the delay pulse being produced at a delay time t set in accordance with the length of cable that is being tested. The reflected signal and the delay pulse produce a voltage at a capacitor 13 which is detected by a meter 15. The meter then indicates the impedance characteristics at a specific point of the cable being tested. The provision of the pulse generators and the voltage detecting capacitor as well as the high impedance meter having a large mechanical inertia creates a small sized, uncomplicated reflectometer for testing lengths of cable to determine the impedance characteristics.

With the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A pocket-sized time domain reflectometer for testing a cable to determine the impedance characteristics of the cable at any point along the length of the cable comprising:

first pulse generator means for producing a test pulse, said test pulse having a substantially sharp peak;

test connector means for connecting the reflectometer to the cable, said test connector means outputting said test pulse to the cable, said test connector means further receiving any reflections by the cable of said test pulse;

adjustable second pulse generator means for producing a delay pulse, said delay pulse being produced at a time t following the production of said test pulse where said time t can be adjusted along the entire length of the cable being tested in accordance with a specific point along its length that is being tested, said delay pulse having a substantially sharp peak;

reflection signal sensing means, connected to said first pulse generator means and said adjustable second pulse generator means and responsive to said test pulse and said delay pulse, for sensing reflection by the cable of said test pulse at said specific point and producing a reflection sensing output signal that is indicative of the presence and magnitude of a reflection signal from said cable at said specific point that has been received by said test connector; and meter means, connected to said reflection signal sensing means, for producing a meter reading indicative of the impedance characteristics of the cable at said specific point in accordance with said reflection sensing output signal;

said reflection signal sensing means comprising a clamp circuit for continually sensing for said test pulse and including,
   a charging capacitor, and
   a diode,
   said charging capacitor maintaining a first voltage level when no reflections are received by said test connector means,
   said charging capacitor maintaining a second voltage level when a reflection indicative of a cable short circuit is received by said test connector means,
   said charging capacitor maintaining a third voltage level when a reflection indicative of an open circuit cable is received by said test connector means.

2. The pocket-sized time domain reflectometer of claim 1, further comprising delay means, connected between said first generator means and said test connector means, for adding a time delay to said test pulse before it is output to the cable by said test connector means and for adding a time delay to reflections received by the test connector means from the cable before the reflection is sensed by said reflection signal sensing means.

3. The pocket-sized time domain reflectometer of claim 1 wherein said meter means comprises a high impedance meter.

4. The pocket-sized time domain reflectometer of claim 1 wherein said delay pulse has a pulse width equal to a pulse width of said test pulse.

5. The pocket-sized time domain reflectometer of claim 4 wherein said test pulse has a pulse width substantially equal to 15 nanoseconds.

6. The pocket-sized time domain reflectometer as claimed in claim 1, wherein said meter means comprises a high impedance meter having a large mechanical inertia.

7. A pocket-sized time domain reflectometer for testing a cable to determine the impedance characteristics of the cable at any point along its length, comprising:

first pulse generator means for producing a test pulse, said test pulse having substantially a sharp peak;

delay test connector means, connected to said first pulse generator means for adding a time delay to said test pulse and outputting said test pulse with the time delay to the cable, said delay test connector means further receives reflections of said test pulse that are produced by the cable and adds a time delay to said reflections;

adjustable second pulse generator means for producing a delay pulse, having a pulse width equal to the pulse width of said test pulse, said delay pulse being produced by said adjustable second pulse generator means at a time t following the production of said test pulse by said first pulse generator means, said time t is adjustable along the entire length of the cable being tested in accordance with a specific point along the length of the cable being tested, said delay pulse having substantially a sharp peak;

reflection signal sensing means, connected to said first pulse generator means, said adjustable second pulse generator means and said delay test connector means and responsive to said test pulse and said delay pulse, for sensing a reflection of said test pulse that is produced by the cable at said specific point, said reflection signal sensing means producing a reflection sensing output signal that is indicative of the presence and magnitude of a reflection signal that has been received by said delay test connector means; and meter means, connected to said reflection signal sensing means for producing a meter reading that is indicative of the impedance characteristics of the cable at said specific point in accordance with said reflection sensing output signal;

said reflection signal sensing means comprising a clamping circuit for continually sensing for said test pulse and including,
   a charging capacitor, and
   a clamping diode,
   said charging capacitor maintaining a first voltage level when no reflections are received by said test connector means, said charging capacitor maintaining a second voltage level when a reflection indicative of a cable short circuit is received by said test connector means,
and said charging capacitor maintaining a third voltage level when a reflection indicative of an open circuit cable is received by said test connector means.

8. The pocket-sized time domain reflectometer of claim 7 wherein said meter means comprises a high impedance meter.

9. The pocket-sized time domain reflectometer of claim 8 wherein said test pulse has a pulse width substantially equal to 15 nanoseconds.

10. The pocket-sized time domain reflectometer as claimed in claim 7, wherein said meter means comprises a high impedance meter having a large mechanical inertia.

11. A method for testing a cable by measuring impedance characteristics of the cable at any specific point along its length, comprising the steps of:
producing a test pulse having a substantially sharp peak;
adding a time delay to the test pulse;
outputting the test pulse with time delay to the cable;
producing a delay pulse at a time t after producing the test pulse, the time t being selected from any of the specific points selected in accordance with a specific point along the length of cable being tested, the delay pulse having a substantially sharp peak;
continually sensing any reflections of the test pulse with time delay that are produced by the cable;
temporary storing the sensed test pulse;
detecting a voltage peak change in a signal being a combination of the sensed reflections and the delay pulse; and
displaying a meter reading corresponding to the detected voltage peak change, the meter reading being indicative of the impedance characteristics of the cable at the specific point selected from any of the specific points;
said detecting step including the steps of;
charging a capacitor,
maintaining a first voltage level at the capacitor when no reflection of the test pulse is received,
maintaining a second voltage level at the capacitor when the reflection of the test pulse is indicative of a cable short circuit, and
maintaining a third voltage level at the capacitor when the reflection of the test pulse is indicative of an open circuit cable.

12. The method for testing a cable as claim in claim 11, further comprising the step of:
adding a time delay to the reflection of the test pulse before said detecting step.

13. The method for testing a cable as claimed in claim 12, wherein said producing a delay pulse step produces a delay having a pulse width equal to a pulse width of the test pulse, the delay pulse having a substantially sharp peak.

14. The method as claimed in claim 11, wherein said continually sensing step is a clamping process carried out by a clamping circuit.

15. The method as claimed in claim 11, wherein the voltage peak change detected in said detecting step is due to a DC voltage shift.

* * * * *